United States Patent [19]

Takada et al.

[11] Patent Number: 4,963,389
[45] Date of Patent: Oct. 16, 1990

[54] METHOD FOR PRODUCING HYBRID INTEGRATED CIRCUIT SUBSTRATE

[75] Inventors: Mitsuyuki Takada; Ryusaku Tsukao; Hayato Takasago, all of Amagasaki, Japan

[73] Assignee: Mitsubishi Denki Kabushiki Kaisha, Tokyo, Japan

[21] Appl. No.: 294,990

[22] Filed: Jan. 6, 1989

Related U.S. Application Data

[63] Continuation of Ser. No. 825,996, Feb. 4, 1986, abandoned.

[30] Foreign Application Priority Data

Feb. 22, 1985 [JP] Japan ................... 60-34789

[51] Int. Cl.$^5$ ............................................. C23C 26/00
[52] U.S. Cl. ........................... 427/98; 427/102; 427/103; 430/315
[58] Field of Search ................. 427/98, 102, 103; 430/315

[56] References Cited

U.S. PATENT DOCUMENTS

| | | | |
|---|---|---|---|
| 4,150,995 | 4/1979 | Moritsu | 427/304 |
| 4,268,614 | 5/1981 | Ueyama | 430/315 |
| 4,394,434 | 7/1983 | Rohloff | 430/315 |
| 4,404,237 | 9/1983 | Eichelberger | 427/102 |
| 4,424,251 | 1/1984 | Sugishita et al. | 428/209 |
| 4,460,624 | 7/1984 | Graciet | 427/102 |
| 4,464,420 | 8/1984 | Taguchi et al. | 427/96 |
| 4,510,179 | 4/1985 | Honjo | 427/98 |
| 4,629,681 | 12/1986 | Takada | 427/103 |
| 4,645,734 | 2/1987 | Takada | 430/315 |
| 4,685,203 | 8/1987 | Takada | 427/102 |
| 4,752,555 | 6/1988 | Takada | 427/98 |

FOREIGN PATENT DOCUMENTS 0071003 2/1983 European Pat. Off. .

OTHER PUBLICATIONS

Base Metal Thick Film Materials, a Review of Their Technology & Applications, Christopher R. S. Needes, E. I. Du Pont de Nemours & Co., Inc., Photo Products Department, Electronic Materials Division, Wilmington, Del. 1989, pp. 94–101.

Primary Examiner—Shrive Beck
Assistant Examiner—Vi Duong Dang
Attorney, Agent, or Firm—Oblon, Spivak, McClelland, Maier & Neustadt

[57] ABSTRACT

A method for producing a high density hybrid integrated circuit substrate capable of forming a very fine pattern of a conductor by means of the chemical plating and at the same time capable of applying the chemical plating, while protecting the resistor formed on the substrate in advance of the chemical plating step, the production method comprising steps of: forming a resistor on an electrically insulating substrate; forming an activating layer for depositing a chemical plating on the electrically insulating substrate in contact with the resistor; forming a stable resin layer, during the chemical plating step, by the photolithography process in a manner to cover the resistor, except for the portion of the activating layer where an electrically conductive layer is to be formed; and forming the electrically conductive layer by the chemical plating on the exposed portion of the activating layer.

5 Claims, 1 Drawing Sheet

METHOD FOR PRODUCING HYBRID INTEGRATED CIRCUIT SUBSTRATE

This application is a Continuation of application Ser. No. 06/825,996, filed on Feb. 4, 1986, now abandoned.

1. FIELD OF THE INVENTION

The present invention relates to a method for producing a hybrid integrated circuit substrate, and, more particularly, it is concerned with a method for production of a substrate for a high density hybrid integrated circuit.

2. DESCRIPTION OF THE PRIOR ART

As this kind of the substrate for integrated circuit, there have so far been used various types, principal kinds of which are as follows: (1) a thick film hybrid integrated circuit substrate to be formed by means of the thick film forming technique, wherein a thick film of electrically conductive paste and/or a thick film of resistive paste is printed and baked on an electrically insulating heat-resistant substrate such as an alumina ceramic substrate; (2) a thin film hybrid integrated circuit substrate to be formed by means of the thin film forming technique such as the evaporative deposition, the sputtering, and so on; (3) those substrates produced by both thick and thin film forming techniques in combination; (4) those substrates produced by forming a printed resistor of polymer on a paper phenolic resin substrate; and so on.

The thin film hybrid integrated circuit substrate is used in various fields where high operating reliability, high performance, very fine circuit patterning, etc. are the essential requirements, and it is mainly used for electronic apparatuses and appliances, etc. for industrial use. The production cost of such thin film hybrid integrated circuit substrate is, however, higher than that of the thick film hybrid integrated circuit substrate.

On the other hand the thick film hybrid integrated circuit substrate is formed by printing and baking onto the substrate a cermet resistive paste such as ruthenium oxide, etc. as the resistor and a precious metal paste such as silver-palladium, platinum-palladium, gold, and so on as the electrically conductive layer. Such thick film hybrid integrated circuit substrate is used in almost every field ranging from the household use to the industrial use.

Further, the thick film resin integrated circuit substrate composed, in combination, of a polymer printed resistor which has been printed and cured onto an organic type substrate such as paper phenolic resin, etc. and an electrically conductive pattern formed by etching of a copper foil or printing and curing of a silver-polymer paste, etc. also finds its use in the field of the household appliances, etc., in which reduction of the production cost is the principal purpose. Such thick film resin integrated circuit substrate, however, is required to use a low temperature curing type resistor, on account of which it is inferior to the cermet resistor formed by high temperature baking and the thin film resistor in respect of its performance and operating reliability. In addition, it has various disadvantages such that its heat discharging property is too poor to be used as the power source device, its high density integration is difficult, and others. Owing to such disadvantages, use of the thick film hybrid integrated circuit substrate tends to be limited to those household appliances, in which reduction of the manufacturing cost is the primary purpose.

The above-mentioned thick film hybrid integrated circuit substrate is able to take a wide range of its resistance value by use of, for example, the ruthenium oxide type cermet resistor as its resistor. Also, since the film is formed by the high temperature baking (500° C. or higher), its performance and operating reliability are superior, hence it is used in almost every field ranging from the household use to the industrial use.

This thick film hybrid integrated circuit substrate, however, has a disadvantage of high production cost on account of use of precious metal for its electrically conductive layer. In addition, silver for use as the principal material is readily dissolved into a molten solder during the soldering work of the circuit elements, causing the problem of the so-called "eaten-by-solder", which therefore requires careful controls in the soldering process such as use of the silver-containing solder, temperature control, and so forth.

Furthermore, for the electrically conductive layer of the thick film hybrid integrated circuit substrate, there may be used a base metal paste such as copper, nickel, etc. in substitution for the above-mentioned precious metal paste, thereby reducing the production cost and decreasing impedance in the electrically conductive layer. However, the formation of such electrically conductive layer with the base metal necessitates the baking operation in the nitrogen atmosphere, which poses various difficult problems such as development of a suitable resistive paste, and so forth.

With a view to removing these disadvantages as mentioned in the foregoing, there was contemplated a method for producing the hybrid integrated circuit substrate in the process steps as shown in FIGS. 2, 3 and 4 of the accompanying drawing. FIG. 2 is a plan view of the electrically insulating substrate of the conventional embodiment, on which a resistor has been formed; FIG. 3 is a plan view of the hybrid integrated circuit formed in accordance with the conventional embodiment; and FIG. 4 is an enlarged, partial cross-sectional view of the hybrid integrated circuit shown in FIG. 3, taken along a line III—III therein.

In the drawing, a reference numeral 101 designated an electrically insulating substrate such as, for example, an alumina ceramic substrate, and so forth, and a numeral 102 refers to a resistor formed on a predetermined part of this electrically insulating substrate 101, the resistor in this case being a ruthenium oxide type cermet resistor formed by baking. A numeral 103 refers to an activating layer for depositing onto the electrically insulating substrate 101 a chemical plating formed by printing in contact with the resistor 102. A reference numeral 104 designates an electrically conductive layer formed on the activating layer 103 by, at least, the chemical plating.

In the first place, as shown in FIG. 2, the cermet resistor 102 is formed by printing and baking of a ruthenium oxide type resistive paste on a predetermined part of the alumina ceramic substrate 101, the baking temperature of which is 500° C. or higher (for example, at 850° C.) Subsequently, the activating layer 103 is formed by printing and baking of an activating paste on one part of the substrate 101 where the electrically conductor is to be formed, the activating paste as printed being in contact with the resistor 102. Incidentally, this activating paste (e.g., "CATAPSTE CCP-3730" - a trademark for a product of OKUNO CHEMI- CAL INDUSTRIES CO. LTD) contains therein a catalytic metal for depositing the chemical plating and a glass component for securing an adhesive force with the substrate 101 at the time of the baking.

The thus constructed alumina ceramic substrate 101 is then immersed in a chemical plating bath to form a plated layer on the activating layer 103 alone, to thereby obtain an electrically conductive layer 104.

In this manner, there can be obtained an ohmic contact between the cermet resistor 102 and the electrically conductive layer 104 through a diffusion layer formed at the time of baking of the activating paste; thus the hybrid integrated circuit substrate provided with the resistor 102 and the electrically conductive layer 104 is formed.

Since the electrically conductive layer can be formed by plating of the base metal such as nickel, etc. in the above-described process steps, the hybrid integrated circuit substrate is produced economically without necessity for the baking operation in any special atmosphere.

With this conventionally practiced method, however, the pattern of the electrically conductor is governed by the pattern of the printed activating paste, on account of which the pattern integration of the conductor can only be attained to the same extent as that of the above-mentioned thick film conductor. Moreover, there is a possibility of the thick film resistor as formed coming into direct contact with the plating liquid to bring about, in some cases, bad influence on the characteristics of the resistor.

The present invention has been made with a view to solving the points of problem as mentioned in the foregoing.

SUMMARY OF THE INVENTION

It is therefore an object of the present invention to provide a method for producing a high density hybrid integrated circuit substrate capable of forming a very fine conductive pattern by the chemical plating, and also capable of applying the chemical plating to the substrate, while protecting,the resistor which has been formed thereon in advance of the chemical plating step.

According to the present invention, in general aspect of it, there is provided a method for producing a hybrid integrated circuit substrate, which comprises steps of: forming a resistor on an electrically insulating substrate; forming an activating layer for depositing a chemical plating on said electrically insulating substrate in contact with said resistor; forming a stable resin layer, during said chemical plating step, by the photolithography process to cover said resistor except for the portion on said activating layer where an electrically conductor is to be formed; and forming said electrically conductive layer by the chemical plating on the exposed portion of said activating layer.

The foregoing object, other objects, advantages, and features of the present invention will become more readily apparent and understandable from consideration of the following detailed description thereof, when read in conjunction with the accompanying drawing and a preferred example thereof.

BRIEF DESCRIPTION OF THE ACCOMPANYING DRAWING

DETAILED DESCRIPTION OF PREFERRED EMBODIMENT

In the following, the present invention will be described in detail with reference to a preferred embodiment thereof as shown in the accompanying drawing.

Figure 1:
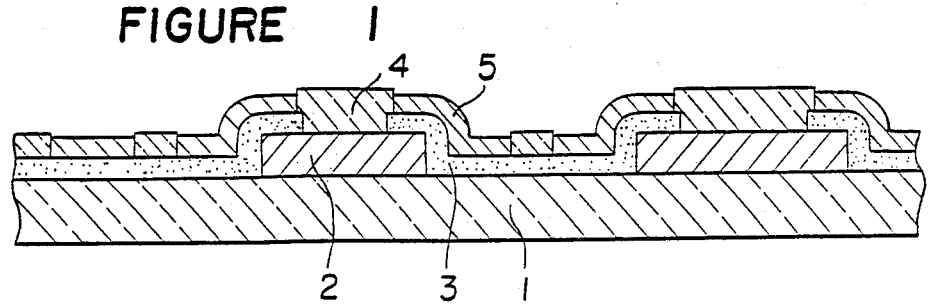
FIG. 1 is a cross-sectional view of the hybrid integrated cicuit substrate according to a preferred embodiment of the present invention.
Figure 2:
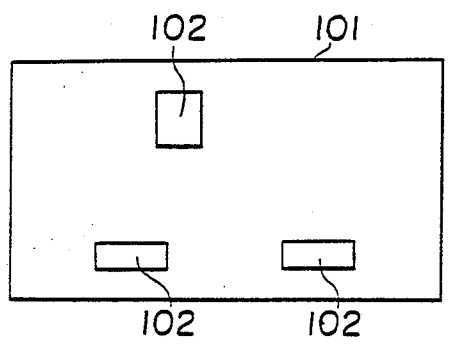
FIGS. 2 and 3 are plan views illustrating the process steps for the manufacture of the conventional hybrid integrated circuit substrate.
Figure 3:
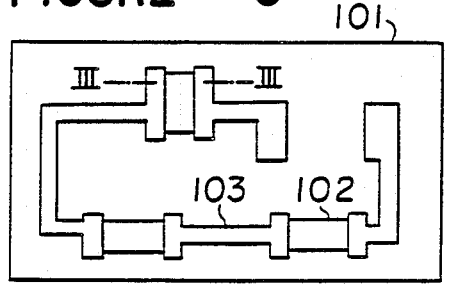
Figure 4:
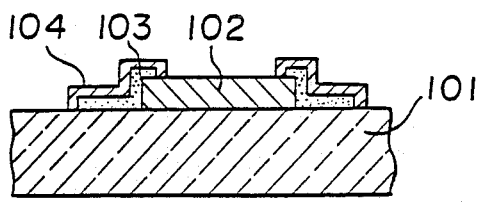
FIG. 4 is a partical cross-sectional view showing the conventional hybrid integrated circuit substrate.

In FIG. 1, a reference numeral 1 designates an electrically insulating substrate (in this embodiment, an alumina ceramic substrate); a numeral 2 refers to a resistor formed on the alumina ceramic substrate (in this embodiment, a ruthenium oxide type thick film resistor); a numeral 3 refers to an activating layer formed on the alumina ceramic substrate 1 in a manner to be in contact with the ruthenium oxide type thick film resistor 2; a reference numeral 4 denotes a resin layer formed to cover the resistor 2, except for the portion on the activating layer 3 where the electrically conductive layer 5 is to be formed (in this embodiment, a polyimide layer formed by use of a polyimide precursor having the photosensitive property); and a reference numeral 5 represents an electrically conductive layer formed by the chemical plating on one portion of the activating layer 3 where no polyimide layer 4 is present.

First of all, ruthenium oxide type resistive paste (not shown in the drawing) is screen-printed on the alumina ceramic substrate 1 and then it is baked at the maximum temperature of 850° C. by use of a belt furnace, thereby manufacturing the ruthenium oxide type thick film resistor 2.

Susequently, a paste composed principally of glass powder and palladium metal particles having the catalytic function with respect to the chemical plating (for example: "CATAPASTE CCP-3730" - a trademark for a product of OKUNO CHEMICAL INDUSTRIES CO. LTD) is screen-printed on the alumina ceramic substrate 1 in a manner to be in contact with the ruthenium oxide type thick film resistor 2, followed by baking the paste as printed (in the case of the above-mentioned "CATAPASTE CCP-3730" , the baking is carried out at the maximum temperature of 680° C.) to thereby form the activating layer 3.

Thereafter, the polyimide precursor having the photosensitivity (for example: "PHOTONEECE" - a trademark for a product of Toray Co., Ltd., Japan; not shown in the drawing) is coated on the overall surface of the alumina ceramic substrate including the resistor 2, followed by drying the same and then subjecting the dried coated film to exposure to the ultraviolet ray using an appropriate mask. After this, the thus UV-exposed substrate is developed with a developing liquid (in the case of "PHOTONEECE", it is composed principally of N-methyl-2-pyrrolidone and methanol) to remove the polyimide precursor on those portions where no exposure is carried out. Then, the developed substrate is further subjected to heating for curing (in the case of "PHOTONEECE", it is 350° C.), to thereby form the polyimide layer 4. In this manner, a stable resin layer can be formed, during the chemical plating step, by the photolithography process to cover the above-mentioned resistor, except for the portion of the activating layer where the electrically conductive layer is to be formed.

In continuation to the above processes, the entire substrate is immersed into a chemical plating liquid (for example, chemical plating liquid "9048" produced by McDermit Co. Inc.) held at a temperature of 60° C. Since the polyimide layer 4 is stable in this chemical liquid, the resistor 2 is well protected, and the copper plating is deposited only on the portion where the above-mentioned activating layer 3 is exposed, whereby the electrically conductive layer 5 is formed. Since this electrically conductive layer is patterened in accordance with the photolithography technique, it can be formed in a very thin lines. Moreover, since the activating layer 103 is formed by use of a paste composed principally of glass powder and metal particles, in which the metal particles, in which the metal particles are present mainly at the center part of the surface of the activating layer to provide the electrical insulation at both sides of the layer, the activating layer of very fine pattern can be obtained.

In the above-described embodiment of the present invention, formation of the resin layer by use of the polyimide precursor having the photosensitive property has been taken as an example.

However, the present invention is not limited to this example alone, but any kind of resin material may be safely used, provided that it can be subjected to the patterning (i.e., it can be subjected to the etching process by use of a separate photo-resist film), and can be stable in the chemical plating liquid. Examples of such resin material are: polyamide carboxylic acid type varnish (having no photosensitive property by itself), epoxy resin (having no photosensitive property by itself), and others.

Furthermore, there may be used various preparations of the catalystic metal and the glass component to be included in the paste for forming the activating layer. That is to say, as the catalytic metal for depositing the chemical plating, there may be used, besides palladium, those metals such as nickel, etc. having the catalytic function and being stable at a high temperature.

As described in the foregoing, according to the present invention, a very fine conductive pattern can be formed by the process steps of: forming a resistor on an electrically insulating substrate; forming an activating layer for depositing a chemical plating on said electrically insulating substrate in contact with said resistor; forming a stable resin layer, during said chemical plating step, by the photograving process to cover said resistor except for the portion of said activating layer where an electrically conductor is to beformed; and forming said electrically conductive layer by the chemical plating on the exposed portion of said activating layer. In this way, the present invention has its effect of being able to produce the high density hybrid integrated circuit substrate, while preventing the resistor from any bad influence during the plating step.

Furthermore, since the resin layer according to the present invention is formed even on the resistor provided on the electrically insulating substrate by exposing the activating layer at its portion where the conductor is required, the conductive layer can be formed at such required portion alone, while protecting the resistor so as not to cause it to come into direct contact with the chemical plating liquid during such chemical plating step.

In addition, since this resin layer is formed by the photograving process, much finer pattern thereof than that of the activating layer to be printed can be made, which makes it possible to obtain the very fine conductive pattern.

Although the present invention has been described with reference to a particular embodiment thereof, it will be understood by those persons skilled in the art that the invention is capable of a variety of alternative embodiments within the spirit and scope of the invention as recited in the appended claims.

What is claimed is:

1. A method for producing a hybrid integrated circuit substrate, consisting essentially of the sequential steps of:
   (i) forming a resistor on an electrically insulating substrate;
   (ii) forming an insulating, activating layer for depositing a chemical plating on said electrically insulating substrate in contact with said resistor;
   (iii) coating a resin precursor on an overall surface of said substrate as modified by steps (i) and (ii), said surface being that on which said resistor is formed;
   (iv) removing a portion of said resin layer by photolithography to form an exposed portion of said activating layer; and
   (v) forming an electrically conductive layer by chemical plating on the exposed portion of said activating layer.

2. A method for producing a hybrid integrated circuit substrate according to claim 1, wherein said resistor is a cermet resistor formed by a baking process.

3. A method for producing a hybrid integrated circuit substrate according to calim 1 or 2, wherein said chemical plating is chemical copper plating.

4. A method for producing a hybrid integrated circuit substrate according to claim 1 or 2, wherien said resin layer is a polyimide layer formed by use of a polyimide precursor having a photosensitive property.

5. A method for producing a hybrid integrated circuit substrate according to claim 1 or 2, wherein said insulating, activating layer is a glass layer obtained by baking of a paste composed principally of glass powder and palladium metal particles having a catalytic function with respect to the chemical plating.

* * * * *